United States Patent [19]

Shepard

[11] Patent Number: 4,546,535

[45] Date of Patent: Oct. 15, 1985

[54] METHOD OF MAKING SUBMICRON FET STRUCTURE

[75] Inventor: Joseph F. Shepard, Hopewell Junction, N.Y.

[73] Assignee: International Business Machines Corporation, Armonk, N.Y.

[21] Appl. No.: 560,624

[22] Filed: Dec. 12, 1983

[51] Int. Cl.$^4$ .................. H01L 21/225; H01L 21/28
[52] U.S. Cl. ........................... 29/571; 29/578; 29/591; 148/187; 148/188
[58] Field of Search .................. 29/571, 578, 591; 148/187, 188

[56] References Cited

U.S. PATENT DOCUMENTS

| | | | |
|---|---|---|---|
| 3,460,007 | 8/1969 | Scott, Jr. | 317/235 |
| 3,484,313 | 12/1969 | Tauchi et al. | 148/187 |
| 3,600,651 | 8/1971 | Duncan | 148/188 X |
| 3,664,896 | 5/1972 | Duncan | 148/187 |
| 3,978,515 | 8/1976 | Evans et al. | 357/44 |
| 4,209,349 | 6/1980 | Ho et al. | 148/187 |
| 4,209,350 | 6/1980 | Ho et al. | 148/188 |
| 4,234,362 | 11/1980 | Riseman | 148/187 |
| 4,236,294 | 12/1980 | Anantha et al. | 29/578 |
| 4,256,514 | 3/1981 | Pogge | 148/1.5 |
| 4,309,812 | 1/1982 | Horng et al. | 29/578 |
| 4,359,816 | 11/1982 | Abbas et al. | 29/571 |
| 4,366,613 | 1/1983 | Ogura et al. | 29/571 |
| 4,378,627 | 4/1983 | Jambotkar | 29/580 X |
| 4,379,001 | 4/1983 | Sakai et al. | 148/187 X |
| 4,400,865 | 8/1983 | Goth et al. | 29/590 X |
| 4,419,809 | 12/1983 | Riseman | 29/571 |
| 4,419,810 | 12/1983 | Riseman | 29/571 |
| 4,424,621 | 1/1984 | Abbas et al. | 29/571 |
| 4,430,791 | 2/1984 | Dockerty | 29/571 |
| 4,445,267 | 5/1984 | De La Moneda et al. | 29/571 |
| 4,464,824 | 8/1984 | Dickman et al. | 59/578 X |
| 4,470,189 | 9/1984 | Roberts et al. | 29/571 |

OTHER PUBLICATIONS

Abbas et al., *IBM TDB*, "Self-Aligned Metal Process for Integrated Circuit Metallization," vol. 26, No. 6, Nov. 1983, pp. 2732-2738.
S. A. Abbas et al., IBM TDB, "Extending the Minimal Dimensions of Photolithographic Integrated-Circuit Fabrication Processing", Sep. 1977, vol. 20, No. 4, pp. 1376-1378.
S. G. Barbee et al., IBM TDB, "Virtual Image Structure for Defining Sub-Micron Dimensions", Aug. 1982, vol. 25, No. 3B, pp. 1448-1449.

(List continued on next page.)

*Primary Examiner*—George T. Ozaki
*Attorney, Agent, or Firm*—George O. Saile

[57] ABSTRACT

A semiconductor body having at least a surface region of a first conductivity is provided with a insulating layer over the surface region. A substantially horizontal first conductive layer is formed over the insulating layer. The insulating and first conductive layers are masked and etched to form openings in the layers to the semiconductor body where the source, drain and gate region of the device is desired to be formed. The openings have substantially vertical surfaces on the layered structure. A conformal, highly doped of a second conductivity conductive layer is formed over the openings having these vertical surfaces and over the insulating and conductive layers. The conformal layer is anisotropically etched to substantially remove the horizontal portions of the conformal layer while leaving the openings with a substantially vertical conformal conductive layer on the sides thereof. The body is heated to cause the dopant of a second conductivity to diffuse into the body from the conformal layer to form the source and drain regions and a first insulating layer upon the surface of the first conductive layer and the conformal layer. A second insulating layer is formed over the vertical conformal layer. Then a gate dielectric is formed upon the surface of the semiconductor body between the source and drain regions. Electrical contacts are made to the first conductive layer through the first insulator layer which effectively makes electrical contact to the source and drain regions through the horizontal conductive layer and the vertical conformal conductive layer.

6 Claims, 6 Drawing Figures

OTHER PUBLICATIONS

H. B. Pogge, et al., IBM TDB, "Narrow Line-Width Masking Method", Nov. 1976, vol. 19, No. 6, pp. 2057-2058.

"A New Edge-defined Approach for Sub-micrometer MOSFET Fabrication" by W. R. Hunter et al., IEEE Electron Device Letters, vol. ED-2, No. 1, 1/1981, pp. 4-6.

"Sub-micrometer Polysilicon Gate CMOS/SOS Technology", A. C. Ipri et al., IEEE Transactions on Electron Devices, vol. ED-27, No. 7, 7/1980, pp. 1275-1279.

"A Novel Sub-micron Fabrication Technique", T. N. Jackson et al., IEDM 1979 Conference, pp. 58-61.

"A New Short Channel MOS FET with Lightly Doped Drain" by Saito et al., in Denshi Tsushin *Rengo Taikai* (Japanese), Apr. 1978, pp. 2-20.

METHOD OF MAKING SUBMICRON FET STRUCTURE

TECHNICAL FIELD

Invention relates to methods for forming self-aligned field effect transistors and more particularly to forming such devices and making electrical thereto.

CROSS REFERENCE TO RELATED APPLICATION

Patent application Ser. No. 560,629 filed Dec. 12, 1983, entitled "Method for Making Self-Aligned Lateral Bipolar Transistors and Resulting Structure" by S. Ogura, et al.

BACKGROUND ART

Integrated circuits have substantially increased in complexities over the years. The technology is moving towards smaller and smaller device structures. The extension of the technology to obtain narrow line widths in the range of one micrometer or less by extending conventional photolithography techniques such as electron beam, ultraviolet light, or X-ray lithography is becoming more difficult and expensive.

Other narrow device structure techniques have been developed to overcome this problem. One such technique is described in H. B. Pogge in IBM Technical Disclosure Bulletin, November 1976, Vol. 19, No. 6, pgs. 2057-2058 entitled "Narrow Line Widths Masking Methods". This method involves the use of a porous silicon followed by the oxidation of the porous silicon. Another technique is described by S. A. Abbas et al., in the IBM Technical Disclosure Bulletin, September 1977, Vol. 20, No. 4, pgs. 1376-1378. This method describes the use of polycrystalline silicon masking layers which are made to mask by first using intermediate mask of oxidation blocking material, such as silicon nitride in the formation of the polycrystalline silicon. Line dimensions below about 2 micrometers may be obtained by this technique.

Methods for forming narrow dimensioned, for example, sub-micrometer regions on the silicon body are disclosed by U.S. Pat. Nos. 4,209,349 and 4,209,350 by I. T. Ho et al., and U.S. Pat. No. 4,234,362 by J. Riseman. These patents involve the formation of substantially horizontal surfaces and substantially vertical surfaces on the silicon body and then forming a vertical layer of a very narrow dimension on the substantially vertical surfaces. This layer may be formed by initially depositing a very narrow dimensioned layer on both the substantially horizontal and substantially vertical surfaces followed by an anisotropic reactive ion etching process to remove the horizontal layer while leaving the vertical layer substantially intact. The vertical layer dimension is adjusted depending upon the original thickness of the layer applied. Alternatively, the vertical layer may be formed by the oxidation of a side edge of a polysilicon layer which has its top surface masked by a oxidation resistant coating such as silicon nitride as described in the S. G. Barbee et al., IBM Technical Disclosure Bulletin, Aug. 19, 1982, Vol. 25, No. 3B, pgs. 1448-1449 or as shown in the H. B. Pogge, U.S. Pat. No. 4,256,514. In these ways a narrow dimension region as one micrometer or less may be obtained.

A further major related problem in the very dense integrated circuit technology is how to electrically contact the various elements and devices of such narrow dimensions in the integrated circuit. It is known to use highly doped polycrystalline silicon as a source of a dopant for regions of monocrystalline silicon to form PN junctions therein. The polycrystalline silicon can either be removed or allowed to become part of the device as the electrical contact for the region formed by the out-diffusion from the polycrystalline silicon. Such processes are taught, for example by H. J. Evans et al, U.S. Pat. No. 3,978,515; J. H. Scott, Jr., U.S. Pat. No. 3,460,007; D. M. Duncan, U.S. Pat. No. 3,664,896; S. Tauchi et al., U.S. Pat. No. 3,484,313 and the aforementioned I. T. Ho et al., U.S. Pat. No. 4,209,350. However, these patents are either silent on the method for the next level metallurgy to the electrical contact or have a second level metallurgy directly above the polycrystalline silicon electrical contact to the PN junction.

Other workers in the field have addressed the electrical contact in other ways, such as U.S. Pat. No. 3,600,651 by providing lateral polycrystalline silicon contacts to a monocrystalline silicon active region. The polycrystalline silicon is then contacted at a more convenient location laterally away from the active region. N. G. Anantha et al., U.S. Pat. No. 4,236,294 also uses the technique of a polycrystalline silicon contact to a PN junction and then a contact to the polycrystalline layer at some convenient distance laterally away from that PN junction. The H. S. Bhatia et al., U.S. Pat. No. 4,507,171 filed Aug. 6, 1982 entitled "Method For Contacting A Narrow Width PN Junction Region" describes further methods for making contact to a narrow width PN junction region by electrically contacting a horizontal conductive layer at a convenient location. The horizontal conductive layer in turn contacts a vertical conductive layer which makes contact to the element of the integrated circuit.

There has been significant effort in the integrated circuit field to develop processes for making submicrometer channel length field effect transistor with a high degree of channel length control. Examples of this work are described in "A New Edge-defined Approach for Sub-micrometer MOSFET Fabrication" by W. R. Hunter et al., IEEE Electron Device Letters, Vol. EDL-2 No. 1, January 1981, pp. 4≠6; "Sub-micrometer Polysilicon Gate CMOS/SOS Technology" by A. C. Ipri et al., published in IEEE Transactions on Electron Devices, Vol. ED-27, No. 7, July 1980, pp. 1275-1279; and "A Novel Sub-micron Fabrication Technique" by T. N. Jackson et al., published in IEDM 1979 Conference Volume, pp. 58-61. The first paper relies on the reactive ion etching technique to form a sidewall silicon dioxide. The second paper utilizes a technique involving lateral diffusion of boron. The third method uses the plating of a metal on the edge of a conventionally patterned metal layer. Other short channel field effect transistor devices are illustrated in the U.S. Pat. No. 4,419,809 to J. Riseman et al., U.S. Pat. No. 4,430,791 to R. C. Dockerty and U.S. Pat. No. 4,445,267 to F. H. De La Moneda et al.

A particularly effective MOSFET configuration allowing densities and performance higher than that heretofore available in such devices is described in "A New Short Channel MOS FET with Lightly Doped Drain" by Saito et al., in Denshi Tsushin *Rengo Taikai* (Japanese) April 1978, pp. 2-20. The LDD N channel MOSFET includes, in addition to the channel separating implanted N+ source and drain regions, sub-micrometer diffused N− regions, which increases the channel breakdown voltage or snapback voltage and reduces device drain junction electron impact ionization (and thus, hot electron emission) by spreading the high electric field at the drain pinchoff region into the N− region. This allows either an increase in power supply voltage or reduction in channel length at a given voltage to achieve performance enhancement. An improved process for making such a device is given in U.S. Pat. No. 4,366,613 by S. Ogura and P. J. Tsang in which the N− LDD region of the device is formed by a controlled N− ion implantation and the forming of sub-micrometer wide $SiO_2$ sidewall spacers abutting to the gate. Other lightly doped drain processes are given in the before mentioned I. T. Ho and J. Riseman U.S. Pat. No. 4,209,349; U.S. Pat. No. 4,209,350 and U.S. Pat. No. 4,419,810 to J. Riseman. These patents also show self-aligned diffused regions formed by outdiffusion from layers formed on the surface of a semiconductor substrate into the substrate. In the above mentioned Ogura and Tsang's patent, the polycrystalline silicon gate plate of the LDDFET is formed by conventional lithographic process. Its minimum achievable length is limited by the capability of the lithographic tool used. Further, there is no highly dense way to electrically contact the elements of the field effect devices. In the present invention the minimum achievable device gate length is no longer limited by the lithographic tools but can be set by design requirement. Devices with channel length less than one micrometer can be readily made with conventional photolithographic tools.

It is therefore desirable to provide a high density, short channel field effect transistor which can be fabricated with submicron channel length and which can be effectively electrically contacted.

SUMMARY OF THE INVENTION

In accordance with the present invention an integrated circuit field effect transistor structure is described which has a sub-micrometer channel length. A semiconductor body having surface regions thereof isolated from other such surface regions by a pattern of isolation is provided. Narrow width PN junctions source and drain regions are located within at least one of the surface regions and spaced from one another. Each of the PN junctions has a width substantially that of the electrical contact. Substantially vertical conformal conductive layers are in electrical ohmic contact to each of the PN junction regions. A substantially horizontal conductive layer is in electrical contact with an edge of each of the vertical conductive layers and separated from the surface region by a first insulating layer. A second insulating layer covers the conformal conductive layers. The horizontal conductive layer is patterned so as to have the conductive lines which contact the source and drain regions electrically separated from one another. A third electrical insulating layer is located over the patterned horizontal conductive layers. A gate dielectric layer is formed over the channel between the source and drain regions. A gate electrode is located upon the gate dielectric layer. The gate electrode is separated from the vertical conductive layers by the second insulating layer. An electrical ohmic contact is made to each of the portions of the patterned horizontal conductive layers through an opening in the third electrical insulating layer. Effectively, this contact makes electrical contact to the narrow width PN junction source and drain regions through the patterned horizontal conductive layer and the vertical conformal conductive layer.

A method for making contact to a small area field effect transistor device is described. A monocrystalline semiconductor body having at least a surface region of a first conductivity is provided with a insulating layer over the surface region. A substantially horizontal first conductive layer is formed over the insulating layer. The insulating and first conductive layers are masked and etched to form openings in the layers to the semiconductor body where the source, drain and gate region of the device is desired to be formed. The openings have substantially vertical surfaces on the layered structure. A conformal, highly doped of a second conductivity conductive layer is formed over the openings having these substantially vertical surfaces and over the insulating and conductive layers. The conformal conductive layer is anisotropically etched to substantially remove the horizontal portions of the conformal layer while leaving the openings with a substantially vertical conformal conductive layer on the sides thereof. The semiconductor body with the layered structure thereon is heated at a suitable temperature to cause the dopant of a second conductivity to diffuse into the semiconductor body from the conformal conductive layer to form the source and drain regions and a first insulating layer upon the surface of the first conductive layer and the conformal conductive layer. A second insulating layer is formed over the vertical conformal conductive layer. Then a gate dielectric is formed upon the surface of the semiconductor body between the source and drain regions. Electrical contacts are made to the first conductive layer through the first insulator layer which effectively makes electrical contact to the source and drain regions through the horizontal conductive layer and the vertical conformal conductive layer.

DISCLOSURE OF THE INVENTION

Referring now more particularly to FIGS. 1 through 4 there is illustrated an embodiment for fabricating a sub-micrometer channel length field effect transistor in a high density circuit structure. The process is illustrated to form N channel MOSFET integrated circuits. However, it would be obvious that P channel field effect transistors can alternatively be formed by the present embodiment by simply reversing the polarity of the various elements of the transistor and associated regions.

Figure 1:
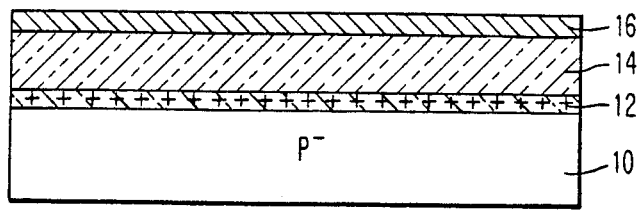
FIGS. 1, 2, 3, 4, 5 and 6 schematically illustrate the process for forming the self-aligned, sub-micrometer channel length field effect transistor structure of the present invention.

FIG. 1 illustrates the first series of steps wherein the semiconductor body is a P− <100> crystallographic oriented monocrystalline silicon body 10. A layer 12 of silicon dioxide is formed by a thermal oxidation process, such as, wet oxygen at a temperature of 970° C. Boron ions are then blanket implanted into the silicon dioxide layer 12 at an energy of between about 15 to 40 KeV and dosage of between about 1 to $3 \times 10^{16}$ atoms/cm². The thickness of the silicon dioxide film is between about 100 to 200 nanometers. A chemical vapor deposited silicon dioxide layer 14 is now deposited upon the silicon dioxide layer 12. The silicon dioxide layer 14 may be deposited by, for example, using $SiH_4Cl_2$ and $N_2O$ at a temperature of about 800° C. or less under atmospheric or low pressure conditions; $SiH_4+O_2$ at about 400° C.; or plasma enhanced chemical vapor deposition using $SiH_4+O_2$. The $SiO_2$ thickness of layer 14 is typically between about 400 and 700 nanometers.

A substantially horizontal first conductive layer 16 is formed over the silicon dioxide layer 14. This conductive layer 16 may be composed of a highly doped polycrystalline silicon material; a refractory metal material, such as, tungsten or molybdenum; a refractory metal silicide, such as, $WSi_2$ or $TaSi_2$; or the so-called polycide film which consists of a layer of a metal silicide in combination with a layer or layers of polycrystalline silicon. The doped polycrystalline silicon thickness would be of the order of 200 to 400 nanometers. The thickness of a refractory metal layer would be of the order of 200 to 300 nanometers. The metal silicide layer thickness would be, for example, from the range of about 200 to 300 nanometers. The polycide thickness would range from about 200 to 400 nanometers polycrystalline silicon and 200 to 300 nanometers metal silicide. It is preferred that the horizontal conductive film be composed of a polycide because its sheet resistance is lower than polysilicon alone and it can be thermally oxidized if necessary, while refractory metals cannot be so readily oxidized.

Figure 2:
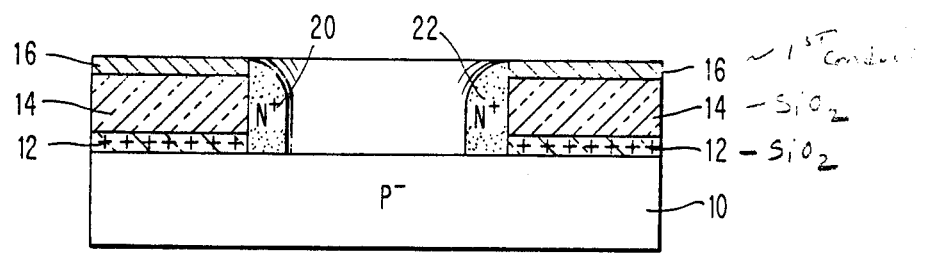
Figure 3:
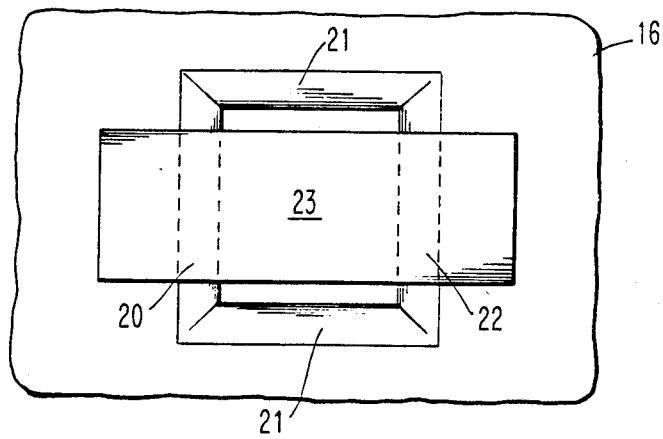

Standard lithography and reactive ion etching techniques are used to form openings in the multi-layered structure of FIG. 1 at the location of the desired field effect transistor structures. The source/drain regions of the field effect transistors are to be located just within the sides of the etched opening. The sides of the opening are required to be substantially vertical. To obtain the substantially vertical sidewalls of the etched out regions it is necessary to use anisotropic etching for each of the layers 12, 14 and 16. The ambient used in the etching process for silicon or silicide is $CF_4/O_2$, $CCl_2F_2/O_2$ or $SF_6/Cl_2$. The ambient used for etching $SiO_2$ or metal is $CF_4/H_2$ or $CHF_3/Ar$. A layer of polycrystalline silicon of N+ type polycrystalline silicon is blanket deposited over the etched structure. The polycrystalline silicon can be doped in-situ. Alternatively, conductive polycrystalline silicon can be formed by depositing substantially undoped polycrystalline silicon and then subsequently ion implant impurities therein and distribute the impurities by a heating process. Thermal diffusion can replace the ion implant-heating processes. If doping is done subsequent to the polycrystalline deposition, typical thermal diffusion process uses $POCl_3$ at 870° C. followed by a drive-in at 925°–970° C. to achieve about 15 ohms/square on single crystal monitor. The desired polycrystalline silicon doping level is about 5 to $10 \times 10^{19}/cm^3$. An ion implantation process uses between about $1 \times 10^{15}$ to $1 \times 10^{16}$ ions/$cm^2$ at 30 to 100 KeV. The preferred conductivity imparting ion is arsenic. The conformal conductive layer of N+ polycrystalline silicon is now subjected to an anisotropic etch using for example $CCl_2F_2+O_2$ at 600 watts, and 20 millitorr of pressure. The result is to substantially remove the horizontal portions of the N+ conformal conductive layer and to substantially leave the substantially vertical conformal conductive layers 20 and 22 as seen in FIG. 2. The vertical conformal conductive layers 20 and 22 are at this point connected with unwanted sidewall regions 21 as seen in the structural top view FIG. 3. These portions 21 are readily removed by use of lithography and etching techniques. The FIG. 3 illustrates the presence of resist mask 23 protecting the layers 20 and 22 from a subsequent wet chemical or plasma etchant.

Following the removal of the unwanted sidewall portions 21, the resist layer 23 is removed. The structure is subjected to an thermal oxidation ambient of wet oxygen at a temperature of 800° C. to obtain a 3:1 to 4:1 oxidation differential between the monocrystalline silicon and the polycrystalline vertical conformal conductive layers 20 and 22. The result of this process is the formation of a silicon dioxide layer 24. About 50 nanometers to 100 nanometers silicon dioxide is grown upon single monocrystalline silicon area and about 300 to 400 nanometers silicon dioxide is grown upon the polycrystalline silicon layer. The resulting minimum thickness of the vertical conformal conductors 20 and 22 is between about 100 to 500 nanometers. During this time some source-drain diffusion will take place from the polycrystalline silicon layer 20, but the final tailoring will be done with an inert anneal somewhere late in the process, if required, to form the source/drain regions 26 and 28, and the P doped field isolation regions 30.

Figure 4:
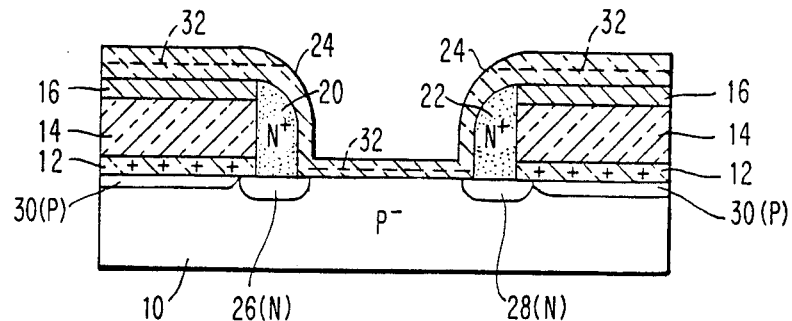

The FIG. 4 structure is now placed in an ion implantation apparatus wherein an N type ion implantation, such as, with the use of arsenic ions is accomplished at about 50 to 120 KeV while using a dosage of between about $5 \times 10^{13}$ to $5 \times 10^{14}$ ions/$cm^2$. The result of the ion implantation process is shown in FIG. 4 wherein the presence of negative ions are shown by the dashed line 32. The N ions have been imbedded in the horizontal portions only of the silicon dioxide layer 24 by the use of a directional ion implantation process. The concentration of these ions in the silicon dioxide layer 24 is of the order of $5 \times 10^{17}$ to $5 \times 10^{18}$ atoms/$cm^3$.

A conformal silicon dioxide chemical vapor deposition form a silicon dioxide layer 36 over the FIG. 4 structure. The deposition uses tetraethyl orthosilicate (TEOS) low pressure chemical vapor deposition (LPCVD) process at about 800° C. or LPCVD $SiH_4+O_2$ at 400° C. to produce a thickness of between about 200 to 400 nanometers silicon dioxide layer 36. An anisotropic reactive ion etchant process using an ambient of either $CHF_3/Ar$ or $CF_4/H_2$ to remove the horizontal portions of the layer 36 while leaving the substantially vertical portions of the silicon dioxide sidewall 36 as shown in FIG. 3. The opening has been chosen wide enough to hereafter form the desired channel width of the field effect transistor device. The exposed portion of the silicon dioxide layer 32 over the monocrystalline silicon body 10 is removed by reactive ion etching right down to the silicon body. The exposed portion of the silicon dioxide layer 32 upon the polycide layer 16 is also etched during this process but since it is thicker a sufficient silicon dioxide layer will remain upon the polycide layer 16 after the etching process.

The horizontal conductor layer 16 is patterned by lithography and reactive ion etching techniques to give the desired wiring pattern at this conductor level. The wiring pattern separates the electrical connections (not shown in the drawing) to source and drain elements of the illustrated device by this etching step.

A channel ion implantation is used for $V_T$ adjustment. The conditions are typically using a boron dosage of between about 2 to $6 \times 10^{11}$ atoms/$cm^2$ at 45 to 65 KeV.

A thin silicon dioxide gate dielectric layer 40 is grown upon the exposed monocrystalline silicon body 10 using wet oxygen at a temperature of 970° C. The preferred thickness of this gate dielectric silicon dioxide is between about 10 to 50 nanometers. During this oxidation process the lightly doped N− regions 46 and 48 are formed by out-diffusion from the silicon dioxide layer 24 having the negative ions 32 therein. It should, of course, be understood that the N− outdiffusion begins during the oxide growth step and will continue with subsequent heat treatments.

Figure 5:
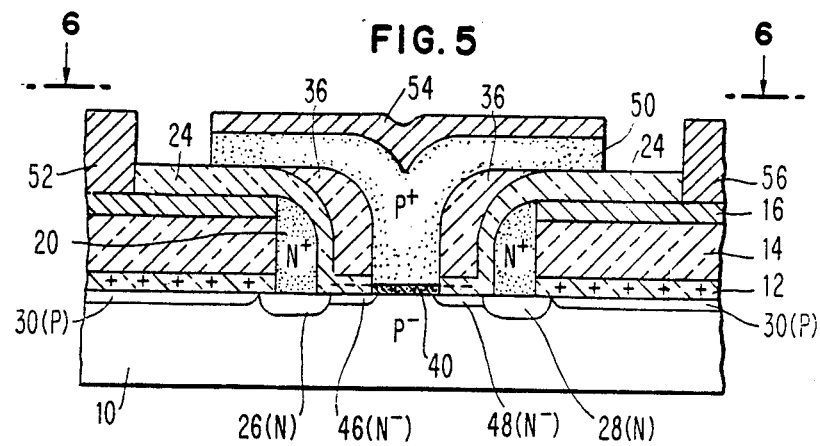
Figure 6:
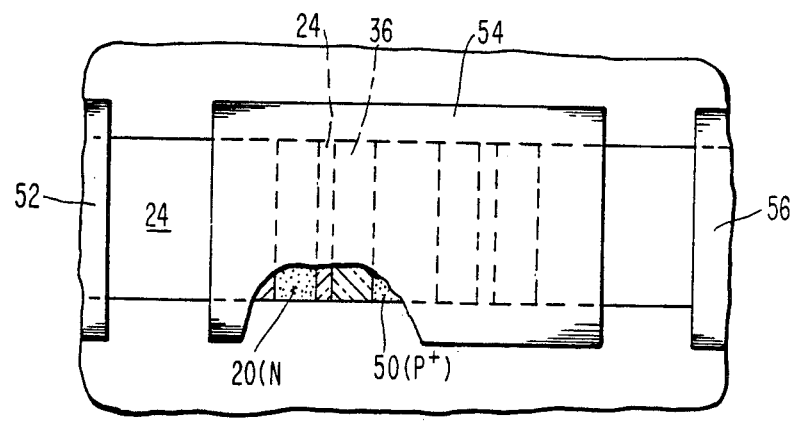

A P+ or N+ polycrystalline silicon layer 50 is now uniformly deposited over the surface and fills the remaining portion of the orginally etched opening as shown in FIG. 5. This polycrystalline silicon layer 50 is to be connected as the gate electrode for the field effect transistor device. Lithography and etching techniques are utilized to delineate the polycrystalline layer 50 to be located only in the desired gate electrode region. Lithography and etching techniques are utilized to form contact openings through the silicon dioxide layer 24 to the horizontal conductive layer 16. A blanket deposition of a suitable metal of, for example, a transition metal, aluminum, aluminum-copper, or the like, over the surface of the structure is made. Other metal contacts may be made by deposition of palladium, or the like, in a reaction with silicon to form metal silicide contacts. Lithography and etching are utilized to delineate in this metal layer for the desired contact structure of the source electrode 52, gate electrode 54, and drain electrode 56. It should be noted that the horizontal conductor 16 has been earlier patterned so that the source electrode 52 connects only through one portion of the horizontal conductive layer 16 and through the vertical conformal layer 20 to the source region 26. In a similar way the drain is connected from electrode 56 through the horizontal layer 16 and the vertical conformal layer 22 to the drain region 28. The FIG. 6 is a illustration of a top view of the FIG. 4 cross-sectional view as seen along lines 6:6.

While the invention has been particularly shown and described with reference to preferred embodiments thereof, it will be understood by those skilled in the art that the foregoing and other changes in form and detail may be made without departing from the spirit and scope of the invention.

What is claimed is:

1. A method of forming a small area field effect transistor device and making contact thereto comprising:
   providing a monocrystalline semiconductor body whose at least surface region is of a first conductivity;
   forming an insulating layer on said surface region;
   forming a substantially horizontal, patterned first conductive layer over said insulating layer;
   masking and etching said insulating and first conductive layers to provide an opening in said layers to the semiconductor body where the source, drain and gate regions of said device is desired to be formed;
   said opening have substantially vertical surfaces on the layered structure;
   forming a conformal highly doped of a second conductivity conductive layer over said openings having said substantially vertical surfaces and over said insulating and patterned conductive layer;
   etching said conformal conductive layer to substantially remove the horizontal portions of said conformal layer while leaving said opening with a substantially vertical said conformal conductive layer on the designated sides of said opening;
   heating said body and said layered structure at a suitable temperature to cause dopant of a second conductivity to diffuse into said body from said conformal conductive layer to form said source and drain regions and first insulator layer upon the surface of the said first conductive layer and said conformal conductor layer;
   forming a second insulator layer over said vertical conformal conductive layer;
   forming a gate dielectric on the surface of said semiconductor body between the said source and drain region;
   forming a gate conductive layer over said gate dielectric;
   forming electrical contacts to said patterned first conductive layer through said first insulator layer which effectively makes electrical contacts to said source and drain regions through said first patterned conductive layer and said vertical conformal conductive layers; and
   forming an electrical contact to said gate conductive layer.

2. The method of claim 1 wherein said vertical conformal conductive layers are composed of highly doped polycrystalline silicon, said patterned horizontal conductive layers are composed of a refractory metal, and said semiconductor body is composed of monocrystalline silicon.

3. The method of claim 2 wherein said vertical conformal conductive layers are composed of highly doped polycrystalline silicon, said patterned horizontal conductive layers are composed of a refractory metal silicide, and said semiconductor body is composed of monocrystalline silicon.

4. The method of claim 2 or 3 wherein said semiconductor body is composed of P type monocrystalline silicon and said source and drains are N type.

5. The method of claim 4 wherein after said heating said body the said first insulator layer is also formed upon the exposed monocrystalline layer, and after said heating an ion implantation of N− type ions are made into the horizontal portions of said first insulator layer, removing the second and first insulator layers on the horizontally exposed said semiconductor surface after the forming of said second insulator, and N− lightly doped source and drain regions are formed adjacent and contiguous to said source and drain regions by out-diffusion from the remaining first insulator layer on the said semiconductor surface during the said forming of a gate dielectric.

6. The method of claim 1 wherein the minimum thickness of the said vertical conformal conductors is between about 100 to 500 nanometers and the channel length is less than about 1000 nanometers.

* * * * *